United States Patent
Lejon

(10) Patent No.: US 7,956,683 B2
(45) Date of Patent: Jun. 7, 2011

(54) HIGH EFFICIENCY LINEAR POWER AMPLIFIERS WITH LOAD COMPENSATION

(75) Inventor: Thomas Lejon, Vallentuna (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 0 days.

(21) Appl. No.: 12/303,697

(22) PCT Filed: Jun. 9, 2006

(86) PCT No.: PCT/SE2006/050192
§ 371 (c)(1), (2), (4) Date: Jun. 4, 2010

(87) PCT Pub. No.: WO2007/142568
PCT Pub. Date: Dec. 13, 2007

(65) Prior Publication Data
US 2010/0237938 A1 Sep. 23, 2010

(51) Int. Cl.
*H03G 3/20* (2006.01)
(52) U.S. Cl. .......... 330/136; 330/149; 330/305
(58) Field of Classification Search .......... 330/136, 330/149, 305
See application file for complete search history.

(56) References Cited

U.S. PATENT DOCUMENTS

| | | | |
|---|---|---|---|
| 5,216,379 A * | 6/1993 | Hamley | 330/134 |
| 5,867,777 A * | 2/1999 | Yamaji et al. | 455/234.1 |
| 6,160,449 A * | 12/2000 | Klomsdorf et al. | 330/149 |
| 6,236,524 B1 * | 5/2001 | Gregoire et al. | 360/46 |
| 6,680,652 B2 * | 1/2004 | Hoheisel et al. | 330/302 |
| 7,113,033 B2 * | 9/2006 | Barnett | 330/129 |
| 7,292,101 B2 * | 11/2007 | Kocaman et al. | 330/254 |
| 2003/0199256 A1 | 10/2003 | Klomsdorf et al. | |
| 2004/0000948 A1 | 1/2004 | Stengel et al. | |
| 2004/0075494 A1 | 4/2004 | Klomsdorf et al. | |

FOREIGN PATENT DOCUMENTS

| | | |
|---|---|---|
| GB | 2 356 093 A | 5/2001 |
| WO | WO 2005/027342 A1 | 3/2005 |

OTHER PUBLICATIONS

English Translation, First Office Action, Chinese Patent Application No. 200680054908.4, Sep. 14, 2010.
International Search Report dated Jan. 16, 2007 (4 pages).
International Preliminary Report on Patentability dated Sep. 26, 2008 (8 pages).
Hyeong Tae Jeong, et al., "Efficiency Enhancement Method for Higher-Power Amplifiers Using a Dynamic Load Adaptation Technique," 2005 IEEE MTT-S International Microwave Symposium, Piscataway, NJ, USA, IEEE, Jun. 12, 2005, pp. 2059-2062.

* cited by examiner

*Primary Examiner* — Patricia Nguyen
(74) *Attorney, Agent, or Firm* — Myers Bigel Sibley & Sajovec, PA

(57) ABSTRACT

The present invention addresses the problem to extend the dynamic power range where the amplifier operates linearly for a full input amplitude swing with improved efficiency. According to the present invention, the above presented problem is solved by changing the delivered power to the load by changing the value of the load and still keeping the amplifier in its linear condition. The invention enables the amplifier to maintain high efficiency over a wider power range.

20 Claims, 12 Drawing Sheets

HIGH EFFICIENCY LINEAR POWER AMPLIFIERS WITH LOAD COMPENSATION

TECHNICAL FIELD

The present invention relates generally to power amplifiers and amplifying methods, and more specifically to high efficiency power amplifiers.

BACKGROUND

Power amplifiers (PAs) are used in a wide variety of communications and other electronic applications. A major consideration in the design of power amplifiers is the efficiency thereof. It is generally desirable for linear power amplifiers to amplify radio frequency (RF) signals in a highly efficient manner. High efficiency is generally desirable so as to reduce battery drain in portable equipment, and the amount of power that is dissipated as heat. Linearity is generally desirable so that, for instance, the amplified signal contains no distortions and does not extend into adjacent frequency spectrum where it may cause interference with ongoing communications.

However, there are tradeoffs between maximum efficiency and high linearity. Specifically, efficiency is generally proportional to the input drive level, and high efficiency is usually not attained until an amplifier approaches its maximum output power, at which point the linearity is significantly degraded. Moreover, where the power amplifier is driven by a input signal having varying amplitude, a conventional class AB or B power amplifier, for example, must typically be operated at or near an average power level that is significantly below its saturation level to accommodate the peak input signal swings. As a result, the efficiency suffers.

The efficiency of conventional linear RF power amplifiers varies with the signal amplitude (envelope), resulting in relatively low average efficiencies, especially when the peak-to-average ratio is high. For example, for a Rayleigh-envelope (multicarrier) signal with a 10-dB peak-to-average ratio, the average efficiencies of ideal class A and B are only 5 percent and 28 percent, respectively. Various techniques for high-efficiency linear amplification (e.g. Kahn, Chiereix and Doherty) have been developed, but are subject to limitations in bandwidth or the dynamic range over which the efficiency is improved.

FIG. 1 is a circuit diagram schematically illustrating of a MOSFET class AB amplifier having a Gate (G), a Drain (D) and a Source (S). The amplifier is supplied with a supply voltage $V_{DD}$ and it receives an input signal $S_{in}$ on the gate G, A current $i_{DS}$ will flow from the drain to the source depending on a gate-source voltage $V_{GS}$ and a drain-source voltage $V_{DS}$. Said amplifier parameters, together with the input signal $S_{in}$(t), will control the current $i_D$ delivered to a resistive load $R_L$ that is connected to the drain. The output power $P_{out}$ delivered from said load is depending on $i_D$.

The vi-characteristics of the amplifier circuit is illustrated in FIG. 2a. The abscissa indicates the drain-source voltage and the ordinate the output current. In this example, peak-value for the drain source voltage is $2V_{DD}$ and the peak-value for the output current $i_D=V_{DD}/R_L$, where $V_{DD}$ is the supply voltage and $R_L$ is the resistance of the load. Said peak-values define two values for the load line, having a slope $-1/R_L$. The dashed graphs marked $v_{GS}=5$ down to $v_{GS}=0$ define the output current $i_D$ as a function of $v_{DS}$ and indicated values for $v_{GS}$. As known for those skilled in the art, amplifier circuits may be operated in two different modes or regions, the active and the saturation region. Two regions are indicated by a dashed-dotted-line. As long the drive signal, i.e. the drive signal, the amplitude swing of said signal is located in the active region, the amplifier's response will be linear, i.e. the relation between the amplitude of the drive signal and the amplitude of the output signal is a linear function. However, in the saturation region said relation is not linear. As wellknown, this non-linear function has a number of serious drawbacks.

FIG. 2b is a diagram illustrating an imaginary variation of the amplitude of a drive signal $S_{in}$(t), e.g. a Radio Frequency (RF) signal. For a RF signal, the peak-to-average swing may be as high as 7-10 dB. If the swing is high, exceeding over a certain amplitude level. $A_{limit}$, and the input voltage is backed-off, the amplifier starts operate in saturation and the output will become non-linear. Therefore, it would be desirable to increase the dynamic power range where the amplifier operates linearly for a full input amplitude swing with improved, maximum efficiency.

BRIEF DESCRIPTION OF THE INVENTION

According one aspect of the present invention, the above presented problem is solved by changing the delivered power to the load by changing the value of the load and still keep the amplifier in its linear condition.

This solution is achieved according to the present invention by taking an amplifier that has an almost linear behaviour from the input to the output and use an impedance tuner to present the optimum $R_L$ at each input power level to the amplifier dynamically. This enables the amplifier to maintain its optimum efficiency over a wider power range.

A method according to the present invention is defined by the characteristic features stated in the independent claim 1.

An amplifier system according to the present invention is defined by the characteristic features stated in the independent claim 6.

A radio terminal according to the present invention is defined by the characteristic features stated in the independent claim 14.

Different embodiments of the invented method, amplifier system and radio terminal is defined by the dependent claims 2-5, 7-13, and 15-17, respectively.

This is a way to improve the efficiency to amplifiers that works as almost linear amplifiers when the input signal is backed off at the input of class A, AB and F and push-pull class B. As long as the optimum load and input drive power for each power level can be presented to the amplifier, the efficiency is maintained at a high level.

BRIEF DESCRIPTION OF THE DRAWINGS

The invention will in the following be described in more detail with reference to enclosed drawings, wherein.

DETAILED DESCRIPTION OF THE INVENTION

In the following, a number of telecommunication standards are mentioned and referenced by acronyms and/or abbreviations, such as 3G (third generation), 4G (fourth generation), HSDPA (High Speed Downlink Packet Access), GSM (Global System for Mobile communications or telecommunications), EDGE (Enhanced Data rates for Global Evolution), GPRS (General Packet Radio Service), UMTS (Universal Mobile Telecommunications System (Service)), WCDMA (Wideband Code Division Multiple Access), and CDMA (Code Division Multiple Access). It should be understood that the present invention is not limited to the above stated standards only, but the invention is also applicable in analogue and digital information transmission over a medium in general and in other non-mentioned close related standards within wireless telecommunication.

Figure 1:
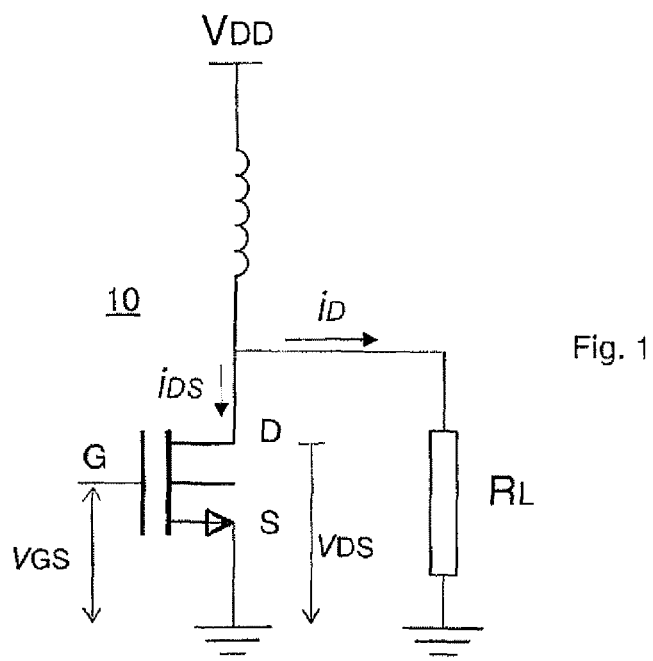
FIG. 1 is a circuit diagram illustrating a class AB amplifier according to prior art.
Figure 2A:
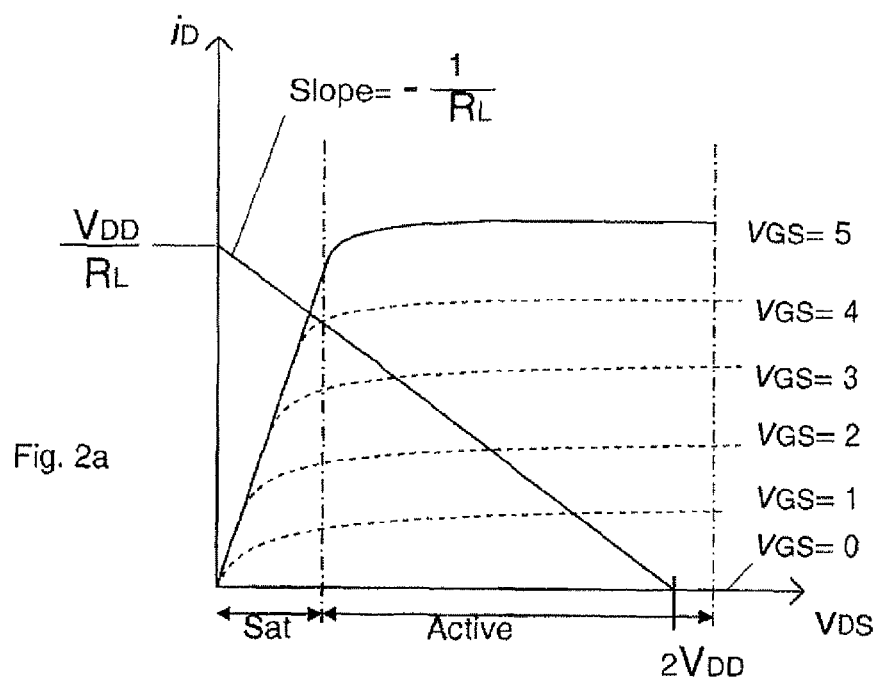
FIG. 2a a diagram showing the theoretical vi-characteristics of the amplifier circuit in FIG. 1.
Figure 2B:
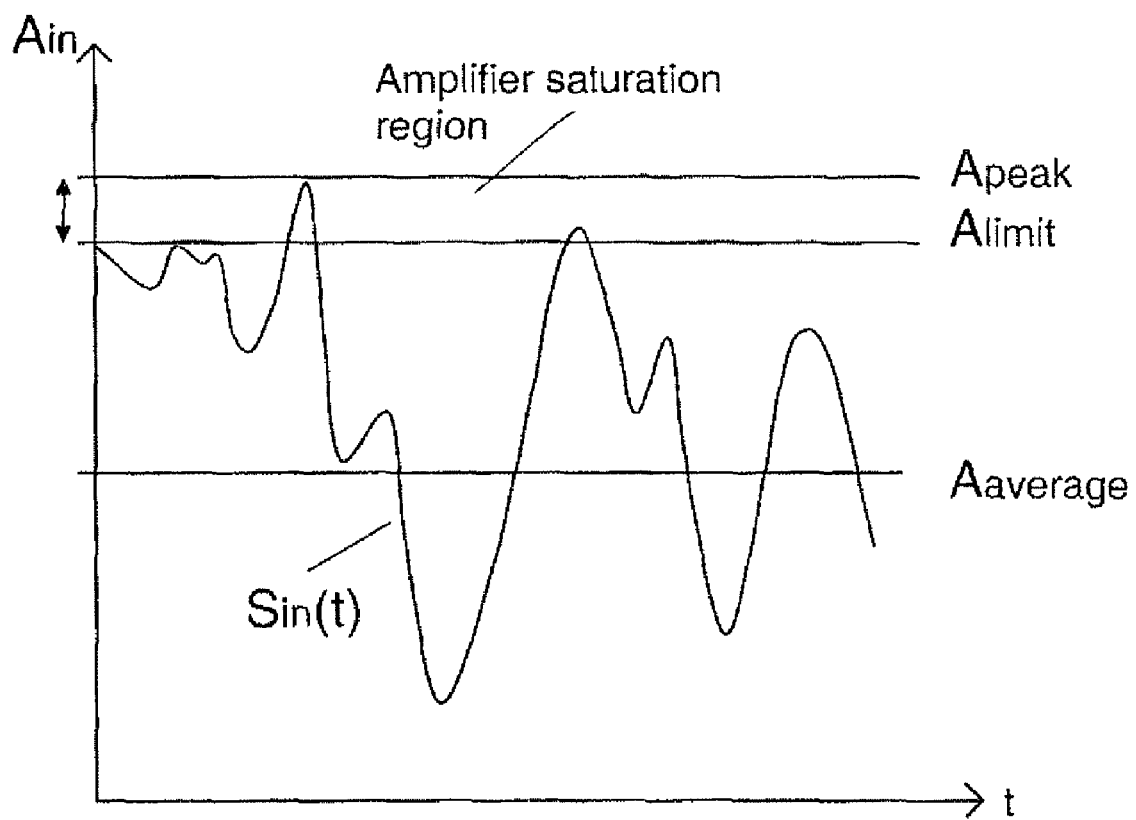
FIG. 2b is a diagram illustrating an imaginary variation of the amplitude of a drive signal $S_{in}$(t), e.g. a Radio Frequency (RF) signal.
Figure 3A:
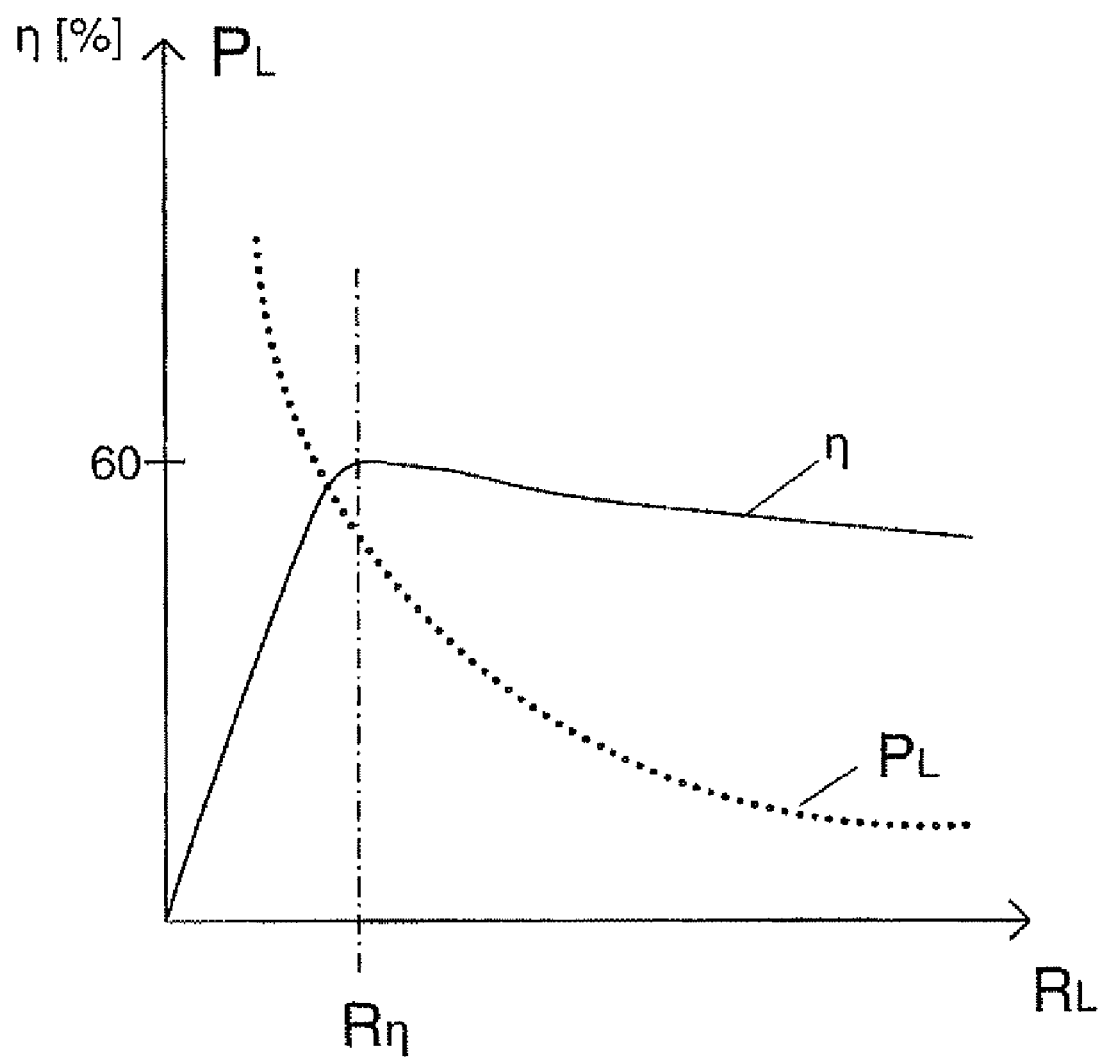
FIG. 3a is a diagram showing theoretically how drain-efficiency and output power, respectively, depends on variation of load, a drain-efficiency characteristic (continuous graph) η and a load power graph (dotted graph) $P_L$, respectively.

As mentioned above, the present invention relates generally to power amplifiers and amplifying methods, and more specifically to high efficiency power amplifiers. To theoretically illustrate how drain-efficiency and output power, respectively, depends on variation of load, a drain-efficiency characteristic (continuous graph) η and a load power graph (dotted graph) $P_L$, respectively, is illustrated in FIG. 3a. For example, an AB amplifier has a maximum efficiency η of 60%, where $\eta=P_L/P_{IN}$ ($P_{IN}$ is the supplied power). The power $P_L$ out decreases asymptotically with increasing $R_L$. The amplifier's drain efficiency η increases from zero to a maximum efficiency at $R_L=R_\eta$. When linear power amplifiers like class A, class AB, push pull B and linear class F is operated close to saturation, the efficiency is at its maximum level. However, the efficiency will slowly drop for increasing load $R_L$.

The inventive idea according to the present invention is to adjust the load $R_L$ to the input power level, which is depending on the amplitude of the input drive signal, and thereby keeping linearity and high efficiency. An adjustment of the load $R_L$ will also cause a change of the slope of the load line, which will be discussed in the following with reference to FIGS. 3b-3c.

Figure 3B:
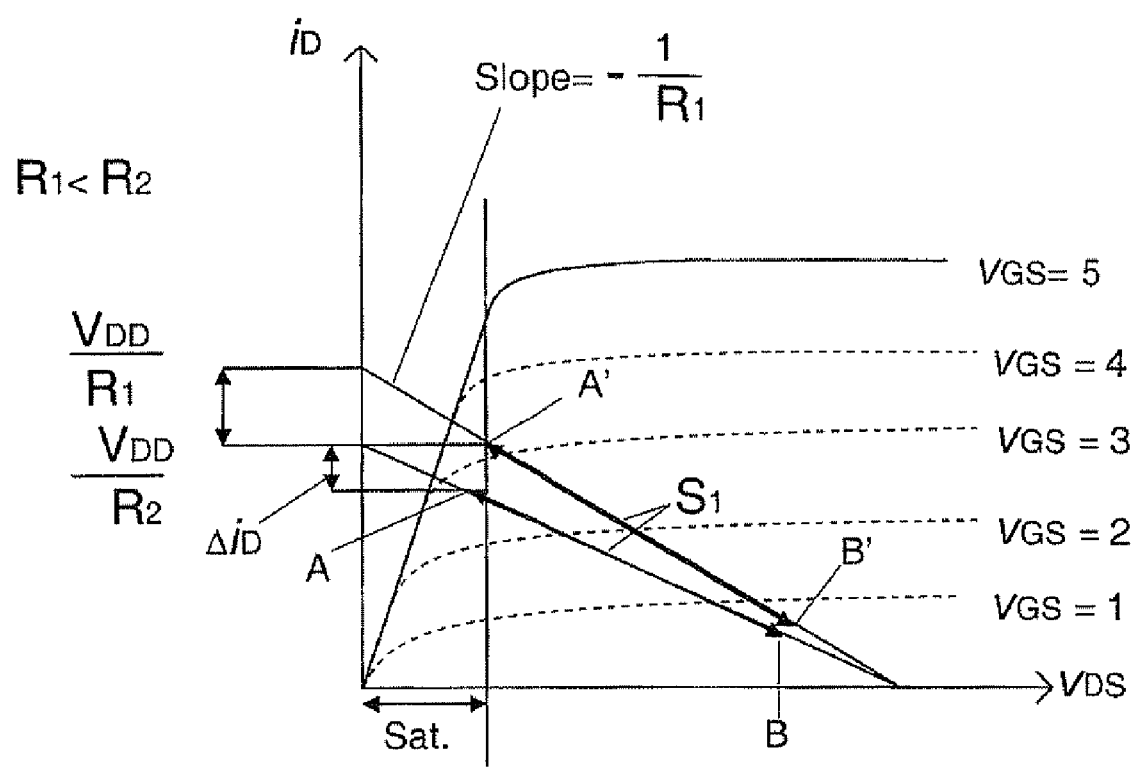
FIG. 3b is a diagram illustrating how a variation in the load influences the slope of load line.

In FIG. 3b, the vi-characteristics of the amplifier circuit is illustrated including two theoretical load lines having different slopes. If the load is changed from $R_2$ to $R_1$, where $R_1<R_2$, the slope of the load line will accordingly change from $-1/R_2$ to $-1/R_1$. Further, a theoretical boarder line between the saturation region and the active region is drawn. Said boarder line is defined as the saturation stop for each level of power input, i.e. amplitude of the drive signal. For any swing, at the saturation stop, the output power is at maximum. In the active region, the linearity of the amplification is secured. Along the load line, the input amplitude $S_1$ swings between points A and B. As an example, for a given load $R_2$, a part of the swing, close to the peak point A, will enter into the non-linear saturation region. By decreasing the load enough, to $R_1$, the load line will tilt and the whole swing $S_1$ will be situated in the active region between peak points A' and B'.

Figure 3C:
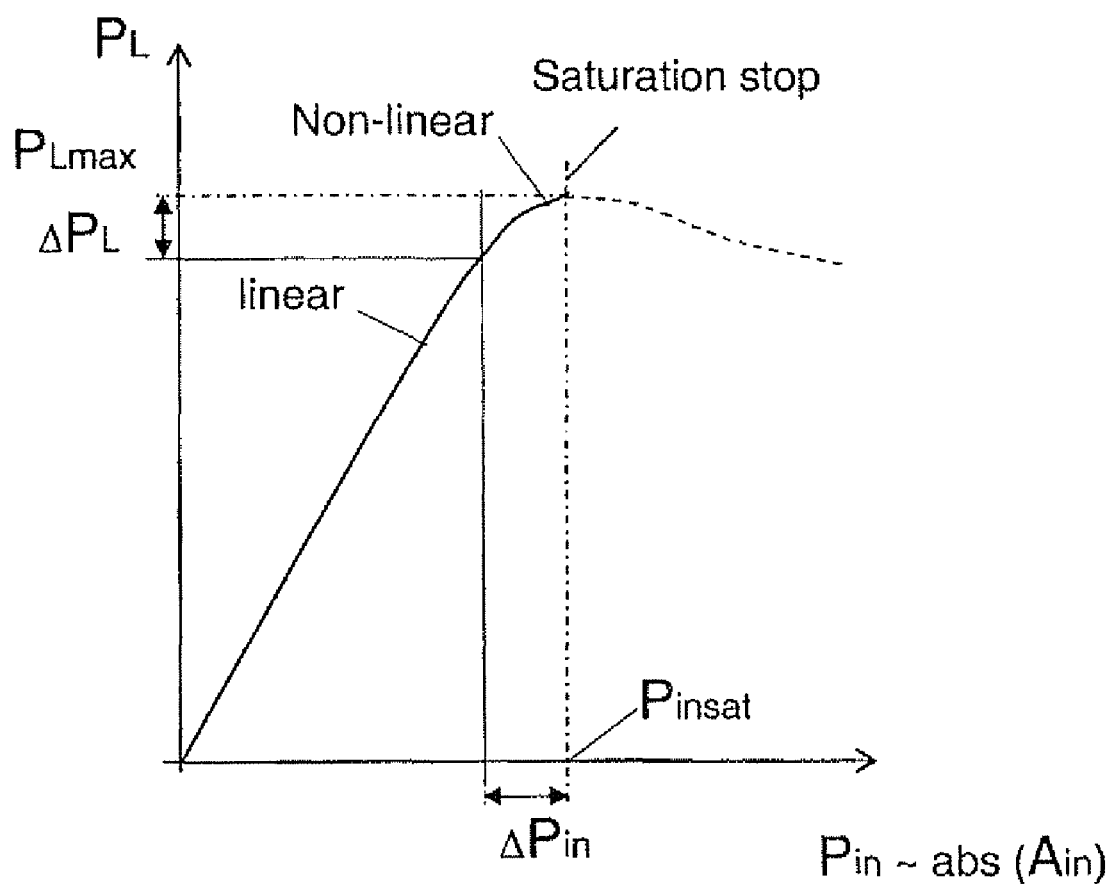
FIG. 3c is a diagram showing the output load $P_L$ as a function of the input power $P_{in}$.

FIG. 3c is a diagram showing a graph illustrating the load output power $P_L$ as a function of input power. The abscissa is input power and the ordinate is the resulting power level. The input power value corresponds to the amplitude level $A_{in}$. The graph is almost linear up to saturation stop, where the maximum, $P_{Lmax}$. Beyond said level, $P_L$ will decrease slowly for increasing $P_{in}$. As shown, the function is not increasing linearly in an interval before and close to $P_{insat}$. Saturation stop is depending on the load and the peak-value of the swing.

Maximum efficiency is desirable, but linearity is a necessity. The inventive idea is to give up some efficiency to secure linearity. The inventive idea may be described as the load to the amplifier is tuned and tracked by using an offset adjusted input power value resulting in a linear dependence between input power $P_{in}$. As illustrated in FIG. 3c, the output power $P_L$ is limited from the maximum $P_{Lmax}$ at saturation stop $P_{insat}$ with a value $\Delta P_L$ corresponding to a decrease in input power $\Delta P_{in}$. The loss of efficiency η is than $\eta_{loss}=\Delta P_L/\Delta P_{in}$.

According to the present invention, see FIGS. 4a-4e said idea is achieved by an amplifier system and a method, wherein variable impedance of a load is tracked to the amplitude of a drive signal that is fed to the amplifier system comprising at least one amplifier. Said system is generating and feeding a power amplified output signal to said load, comprising the following steps of:

determining an instant value related to the envelope/amplitude of the drive signal (step 402);

determining an adjusted value using an offset value $S_{off}$ and the instant value (step 404);

generating an adjusted value depending control signal ($v_{control}$) for controlling and adjusting the variable load impedance (step 406);

adjusting the variable load impedance by means of the control signal (step 408).

Figure 4A:
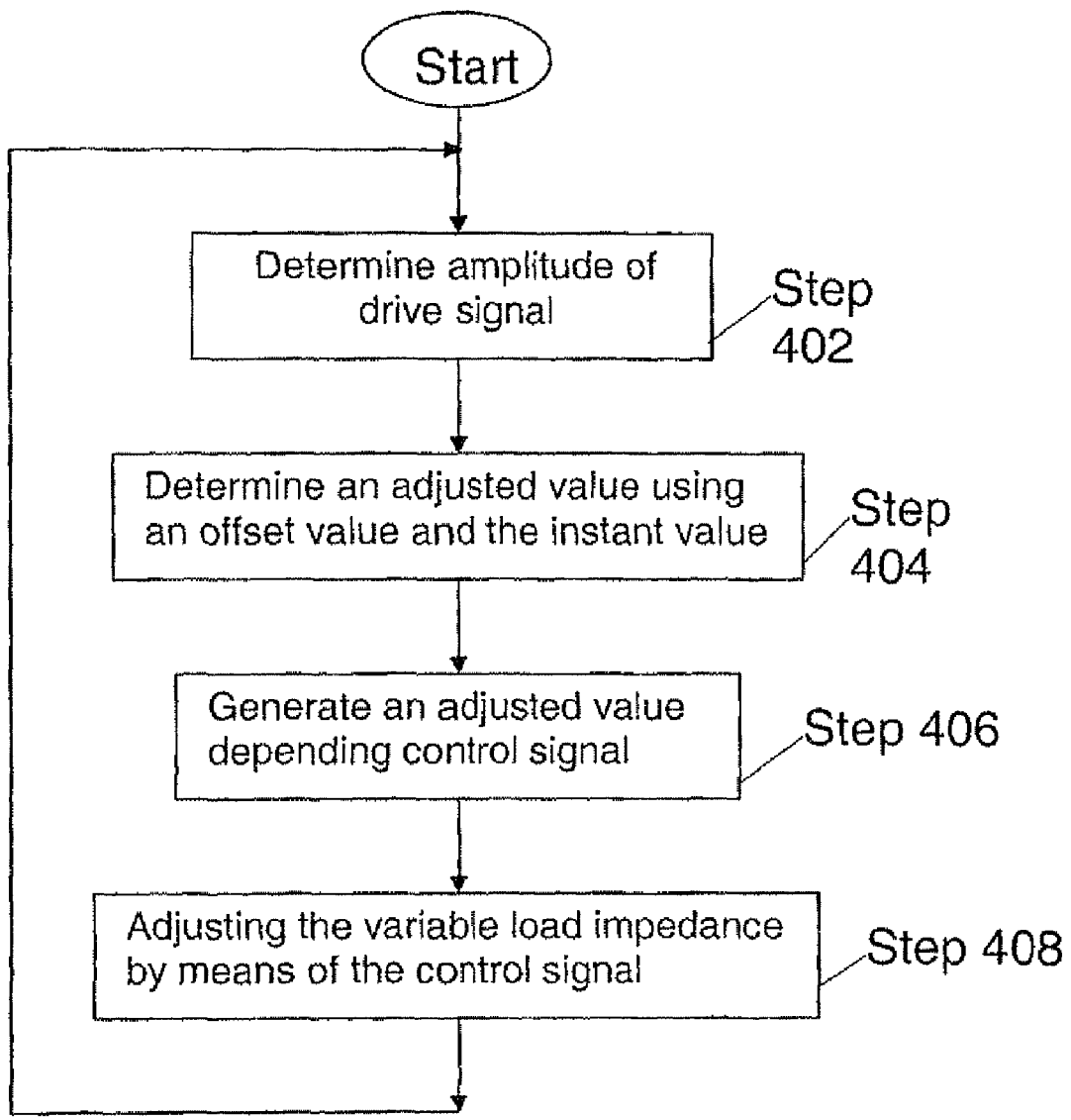
FIG. 4a is a flowchart showing the method according to the present invention.

The steps of the invented method are illustrated in FIG. 4a, and will be further described below.

Figure 4B:
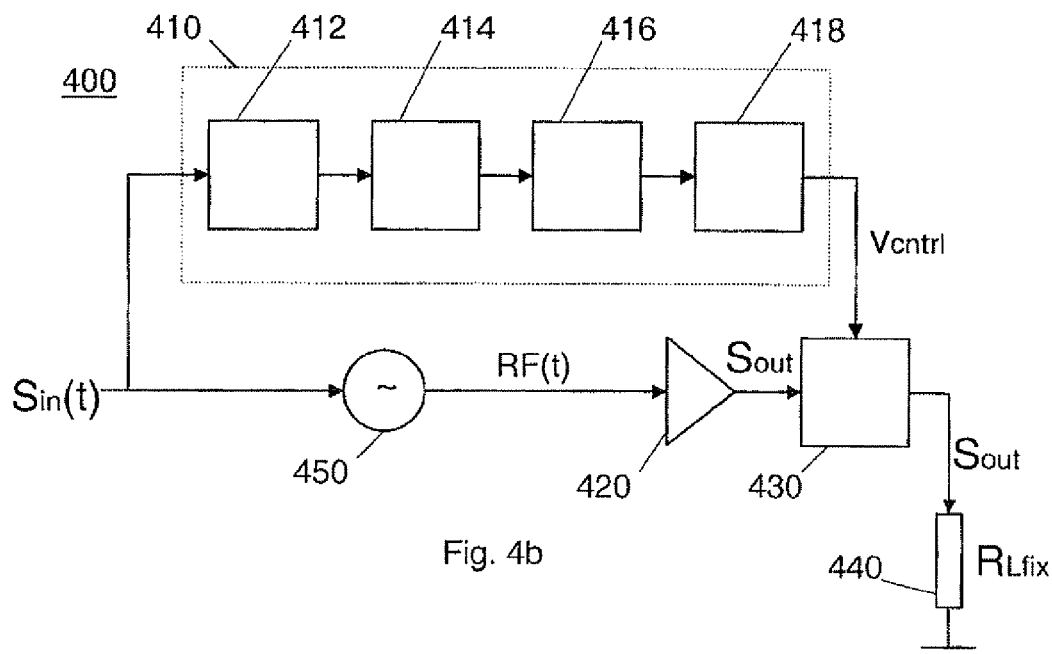
FIG. 4b is a block diagram showing a preferred embodiment of the amplifier system according to the present invention.

FIG. 4b presents an amplifier system 400 comprising a load tracking arrangement 410 according to the present invention. The system may be used for power amplification of signals, especially modulated radio frequency (RF) signals in the GHz frequency band, to be transmitted over the air interface in a cellular mobile radio telecommunication network, which will be further described in reference to FIGS. 6 and 7. Such telecommunication networks are designed to support at least one of a number of to different telecommunication standards such as EDGE, 3G, 4G, HSDPA, etc. The present invention may therefore be suitable for power amplification in transmitters in base stations of telecommunication networks.

The amplifier system 400 comprises at least one linear power amplifier 420. It is sometimes necessary to back off the input signal, or drive signal, when a part of the input signal's swing will appear in the non-linear saturated region of the amplifier. However, the system will lose efficiency. Examples of such amplifiers are class A, class AB, class F or push-pull class B amplifiers. A drive signal $S_{in}(t)$ to the system 400 is modulated on a carrier with the frequency $w_c$ by a modulator 450 before being amplified by the linear power amplifier 420 and conducted, as an power amplifier signal $S_{out}$, to a load impedance 440. e.g. an antenna (aerial), here denoted as $R_L$.

To overcome the dropping efficiency problem of said power amplifier, an impedance tuner 430, providing a variable impedance load $Z_{var}=R_{var}$, is provided between the amplifier 420 and the fix load $R_{Lfix}$ 440. The amplifier feeds the tuner 430 and the load $R_L$ with an output signal $S_{out}$. If the tuner is lossless, the load of the tuner is resistive, and the output signal $S_{out}$ will not be distorted. The impedance tuner is preferably lossless, but a low loss impedance tuner giving a neglectable power loss (due to an existing complex impedance component) is possible to use. The function of the impedance tuner according to the present invention is to provide dynamically the optimum $R_{Ltot}=R_{Lfix}+R_{var}$ at each power level to the amplifier. By adjusting the variable load $R_{var}$, the amplifier 420 to maintain an optimum efficiency over a wider power range. An implementation of said impedance tuner will be presented further down of this specification in reference to FIG. 4e.

Figure 4C:
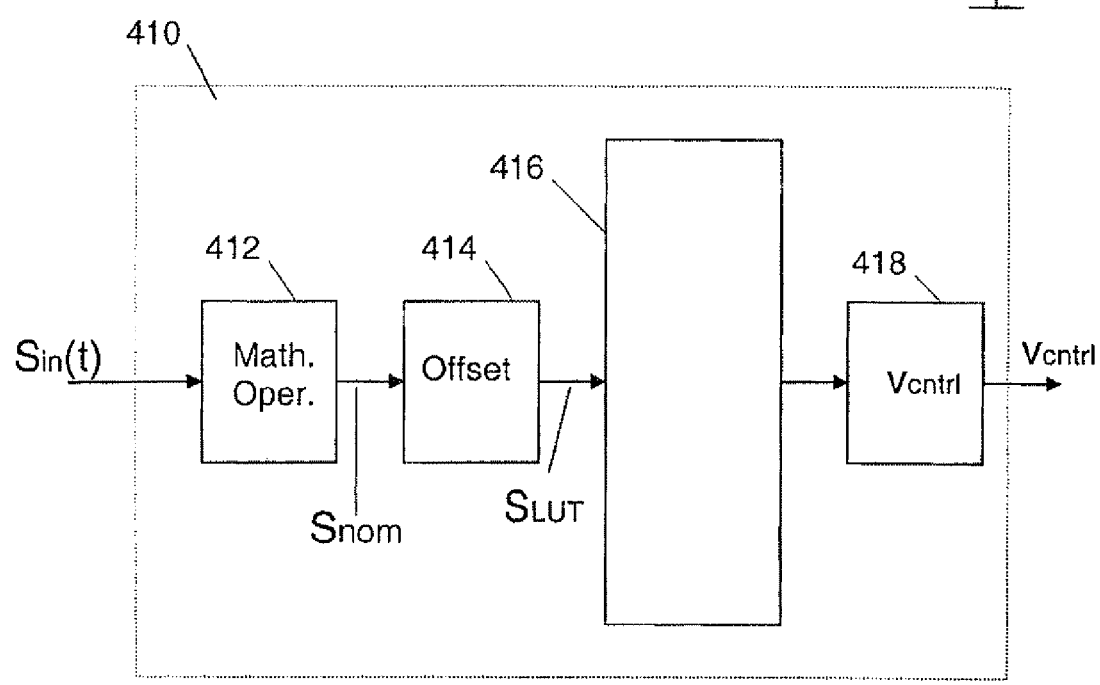
FIG. 4c is a block diagram showing a preferred embodiment of a load tracking arrangement.

The variable load $R_{var}$ of the impedance tuner 430 will be controlled by a load control signal $v_{cntrl}$ that is generated by a load tracking arrangement 410, which will now be described in more detail with reference to FIG. 4c.

The load tracking arrangement 410 comprises a mathematical operator means 412, an offset value means 414, look-up-table LUT 416 and a control signal generating means 418. The drive signal $S_{in}(t)$ will be used as input signal to the load tracking arrangement 410. The instant amplitude, or envelop, of said drive signal will be processed in the following way to generate a load control signal $v_{cntrl}$ for controlling the impedance tuner 430. The instant amplitude value $A_{in}$ of the drive signal $S_{in}$ is first processed by a mathematical operator means 412 that produces the absolute value $abs(S_{in})$ of the drive signal. Said operation may be performed by a transforming means that transform. Cartesian coordinates to Polar coordinates, i.e. radial and angular coordinate. The radial coordinate corresponds to the amplitude of the drive signal. The angular coordinate will not be used.

This absolute value is divided by a pre-determined and pre-stored maximum value of the $S_{in}$, to determine a nominal value $S_{nom}=(abs(S_{in})/max\ abs(S_{in}))^2$ in the interval [0, 1]. The nominal values $S_{nom}$ is corresponding to the stored values of the LUT 416. Examples of such $S_{nom}$ values are indicated in the LUT of FIG. 4c. In the same LUT 416, output voltage steps 1-512 are indicated. Each $S_{nom}$ value corresponds to an output step and a corresponding wished $P_L$. For each input value received by the LUT, a corresponding output voltage step will be fed to the output of the LUT and read by a control signal generating means 418.

In accordance with the invention, the nominal value $S_{nom}$ is thereafter adjusted by means of an offset value means 414 that will produce a look-up-table LUT input value $S_{LUT}$. Depending on the pre-set offset value $S_{off}$, it will be possible to increase or decrease $S_{LUT}$. Said operation will correspond to a change of the output voltage a pre-determined number of steps in the LUT 416. Therefore, the offset process is possible to define by the equation $$S_{LUT}=S_{nom}+S_{off}$$

By means of the offset adjusting equation, it is possible to determine the correct load tracking control voltage $v_{cntrl}$ in the look-up-table 416. The load tracking signal $v_{cntrl}$ is controlling the impedance tuner 430, which impedance is tuned to an impedance value $R_{Lfix}$, for providing an optimum $R_{Ltot}=R_{Lfix}+R_{var}$ at each power level to the amplifier 420.

Said control signal is dependent on the design of the tuner. In the present embodiment, the control signal is a DC signal of which the DC voltage is dependent of the value in the second column of the LUT.

The LUT device 416 and how to program and operate is regarded to be already known to a person skilled in the art. The offset value means 414 may be implemented as an adder/subtracter device, however, other mathematical processes may be used. A person skilled in the art will also be able to design a control signal generating means 418, for instance by using a voltage source and a transistor circuit controlling the delivered voltage $v_{cntrl}$ in correspondence to the output from the LUT 416.

Figure 4D:
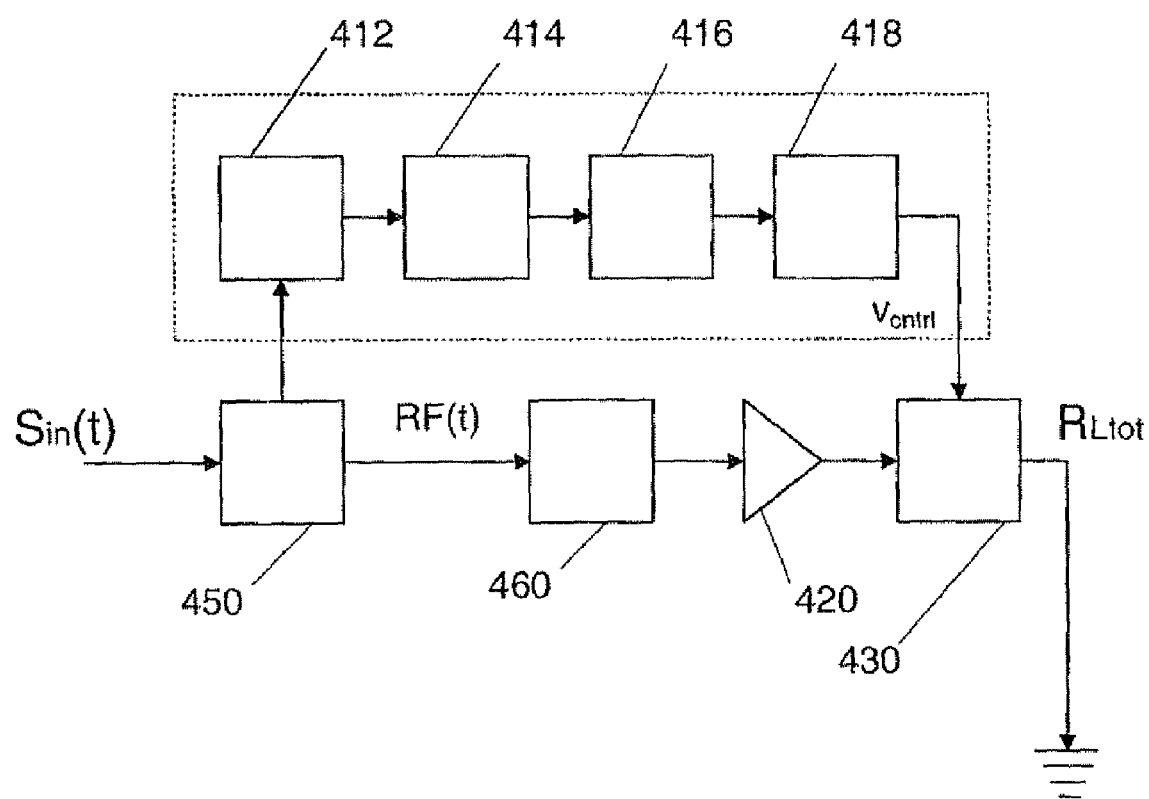
FIG. 4d is a block diagram showing another embodiment of the amplifier system according to the present invention.
Figure 4E:
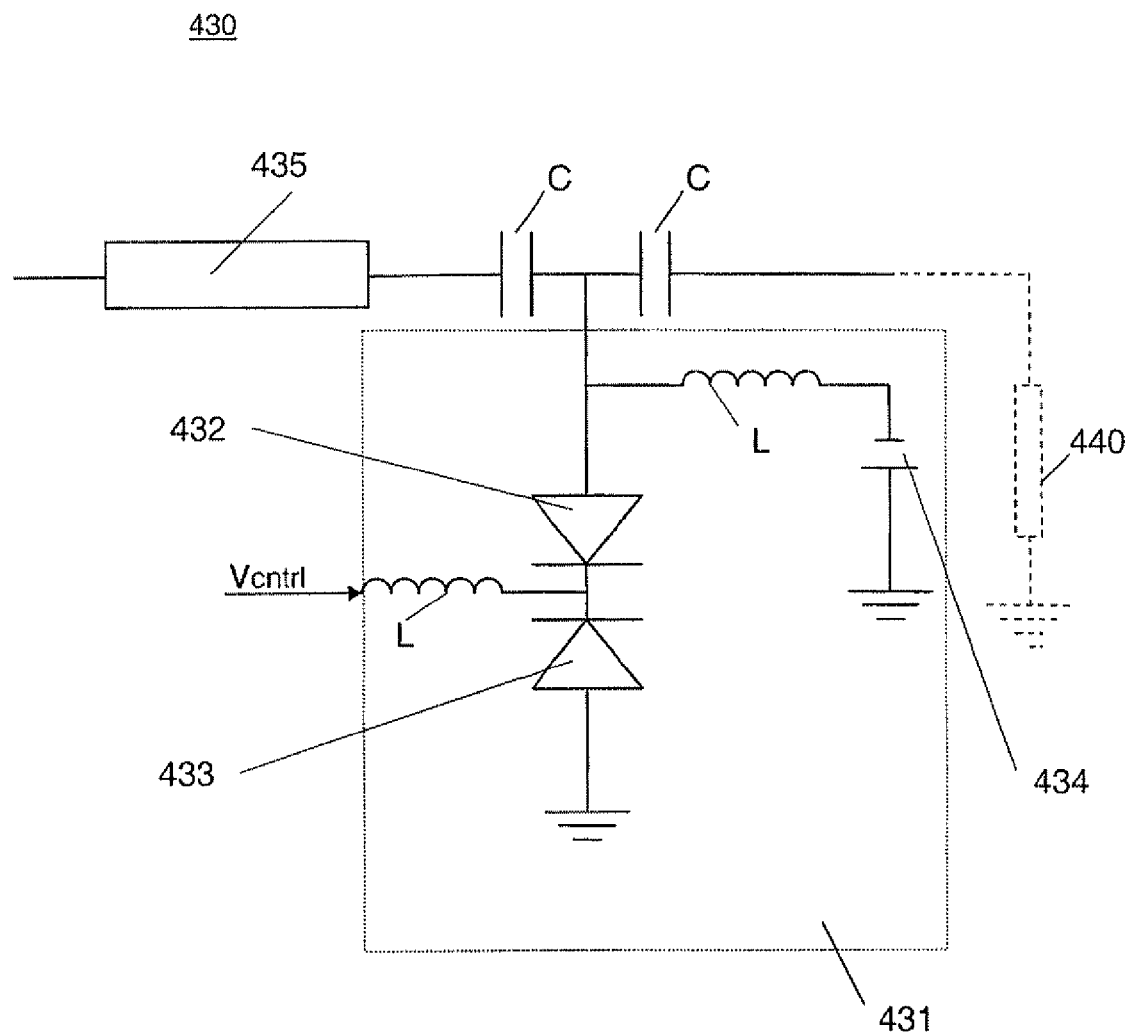
FIG. 4e is a block diagram showing a lossless impedance tuner.

An embodiment of a lossless impedance tuner 430 is presented in FIG. 4e, which is a circuit diagram. The use and control of impedance tuners are earlier known to a person skilled in the art, for example from the document "High-Efficiency Linear Amplification by Dynamic Load Modulation" by Frederick H. Raab, pp. 1717-1720, 2003 IEEE MTT-S Digest. The present impedance tuner 430 is a tuneable filter arrangement, which comprises a transmission line 435 with constant impedance $Z_0$ and a diode arrangement 431. The diode arrangement comprises two diodes 432 and 433, here varactor diodes, which cathodes are connected, as illustrated in the figure. Both diodes are charged in the reverse direction, the first diode by a DC bias source 434 and the second diode by earth potential. Their cathodes are connected to an input for a control voltage $v_{cntrl}$ that will be able to control the diode capacitance of the diodes. By controlling the diode capacitances, it is possible to adjust the impedance to compensate for the reactance effect depending on the current power level and achieve a pure optimal resistive load, $R_{var}$, at each power level to the amplifier output. In this embodiment, the transforming means generates the input control voltage $v_{cntrl}$.

Figure 5:
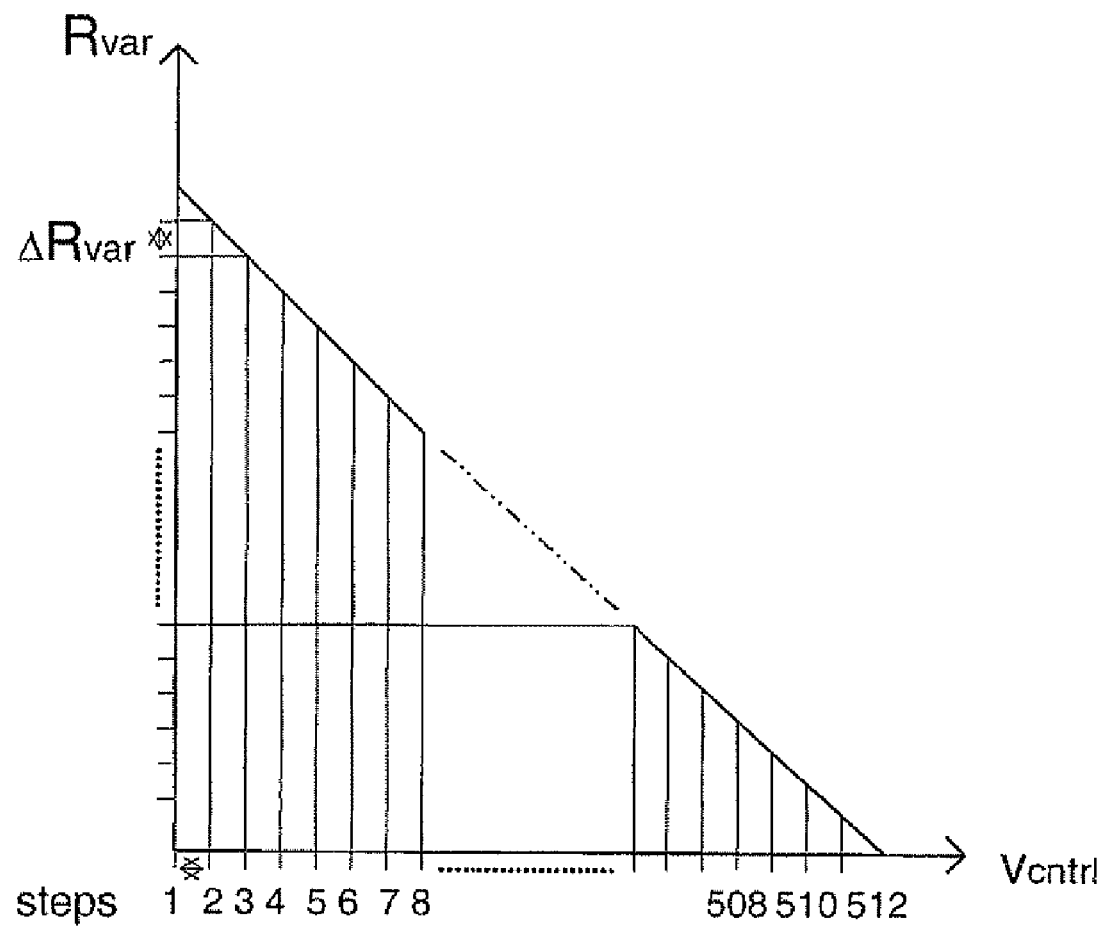
FIG. 5 is a diagram showing the variable load of the impedance tuner as a function of the control voltage $v_{cntrl}$.

FIG. 5 is a diagram showing the variable load $R_{var}$ of the impedance tuner as a function of the control signal $v_{cntrl}$. The load-control signal function is linear and the graph has a negative slope. The amendment of the $v_{cntrl}$ one step (e.g. from 1 to 2, as illustrated in the figure) will cause an amendment of the variable load impedance $\Delta R_{var}$. If $\Delta R_{var}$ becomes equal to zero, the total load $R_{Ltot}=R_{Lfix}$. The steps of $v_{cntrl}$ is stored in the LUT and the size of the voltage steps and their corresponding voltage, is defined by the voltage generator 418.

FIG. 4d is a block diagram showing another embodiment of the amplifier system according to the present invention. This second embodiment differ from the first described. Preferred embodiment only regarding a number of features will now be described. The remaining parts id described in said preferred embodiment. In the second embodiment, the modulator means 450 and transforming means that transform Cartesian coordinates to Polar coordinates (located in the mathematical operator means 412 in the preferred embodiment) has been integrated together. This is practical if the modulator 450 serves an out phasing amplifier system. The radial component r(t) of the drive signal is generated and fed to the amplifiers 420 for the amplification. Said radial component may therefore also be used by the mathematical operator means 412 in the load tracking arrangement 410, which other means 414, 416 and 416 operates as described above. Further, may a digital pre-distortion (DPD) block 460 be connected before the amplifiers 420. Said block is used for improving the linearization in the digital domain of the used amplifiers. In addition, the fixed load $R_{Lfix}$ may be integrated with the impedance tuner and implemented as one block $R_{Ltot}$ 430.

It must be regarded to a person skilled in the art that the load tracking arrangement 410 and the impedance tuner 430 may be implemented as one single functional block.

The described invented amplifier systems are possible to integrate on an ASIC in different ways.

The present invention is preferably adapted for use in radio terminals, e.g. mobile radio terminals or base stations of cellular mobile radio telecommunications systems, or within satellite systems.

Figure 6:
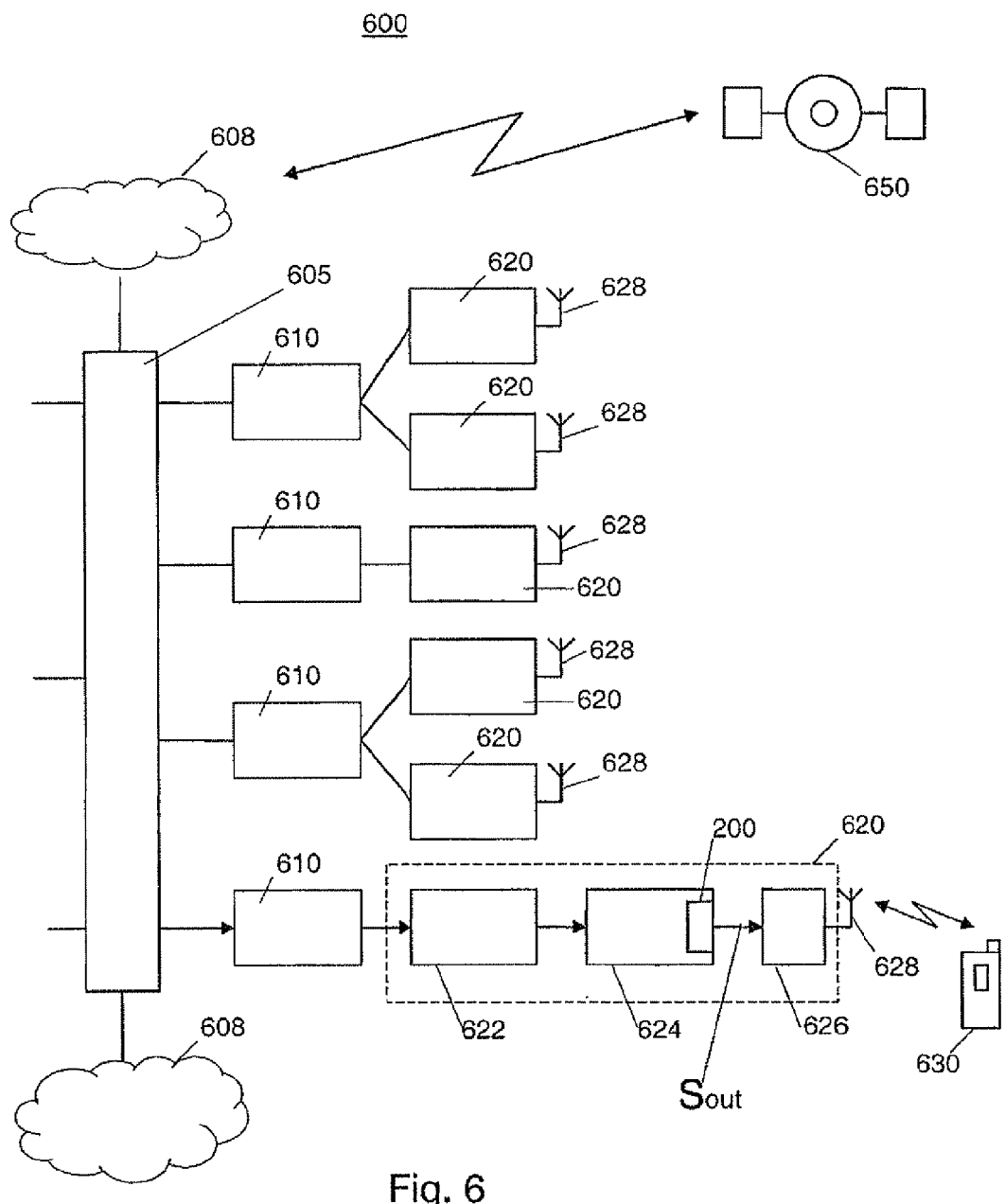
FIG. 6 is a block diagram illustrating a mobile radio terminal comprising the invented amplifier system.

FIG. 6 is a schematic illustration of a WCDMA network architecture 600 comprising base stations 620, node B. The network comprises a Core network 605 to which a number of Radio Network Controllers 610 (RNC) are connected and other networks 608, e.g. Public Switched Telephony Network (PSTN), Public data Networks, Internet, Integrated Services Digital Network (ISDSN), other Public Land Mobile Networks (PLMN). Satellite telecommunication systems, etc. The RNC 610 controls at least one dedicated node B 620 (Base Station in GSM networks). The RNC 620 controls and handles the uplink and downlink communications over the air interface between a node B 620 (connected to the RNC) and subscriber units, such as radio handset terminals 630. A node B comprises, among other units 8 not shown), Base Band units 622, Radio Units 624, Filter Units 626 and an antenna system 628. The Base Band unit 622 transforms digital messages into I and Q vectors, which are transferred to the Radio Unit 624. In the Radio Unit, said vectors are modulated on carriers resulting in signals $S_{in}$. Before transmission, the signals $S_{in}$ are power amplified. Therefore, the Radio Unit is equipped with at least one composite power amplifier system 200 according to the invention. The amplifier system 200 power amplifies $s_{in}$ and provides an output signal $S_{out}$ to the antenna system 628 for transmission over a radio channel to a subscriber unit 630. e.g. a radio terminal handset.

It is also possible to use the composite power amplifier system 200 according to the invention in a satellite 650 for mobile radio telecommunications. The satellite will then operate as a repeater station comprising transmitters and/or transceivers in the Radio Units 624 and antenna systems 628 for handling the communication with a control station in a Satellite telecommunication systems 608 and satellite radio terminals 630 located on the earth.

Figure 7:
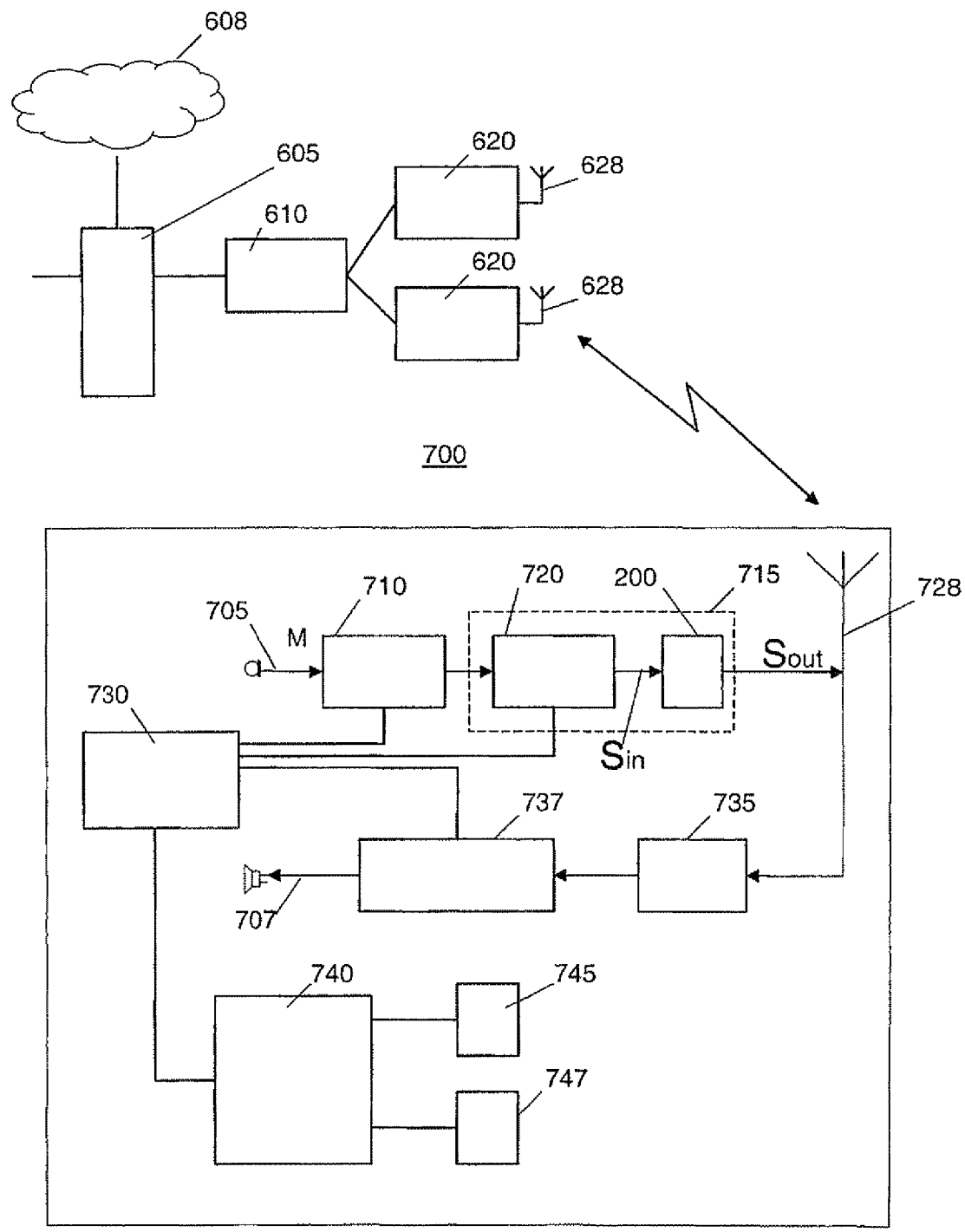
FIG. 7 is a block diagram illustrating a base station configuration and a satellite system comprising the amplifier system according to the invention.

FIG. 7 illustrates schematically a mobile radio terminal, also denoted handset, 700 for mobile radio telecommunications. The terminal comprises a microphone 705 for transforming voice and audio to an electrical signal M(t). Said signal M(t) is processed before being modulated and power amplified by a first signal processing block 710 comprising A/D-converter unit, Speech and channel coder units, and digital formatting devices for arranging the signal into a suitable transmitting format for mobile radio telecommunication systems like GSM/(EDGE) GPRS UMTS (WCDMA), and CDMA-systems. In the transmitter 715, or Radio Unit 720, the processed signal $s_{in}$, which is generated by the block 710, is modulated in a modulator (not shown) and thereafter power amplified by the composite power amplifier system 200 according to the present invention, generating an output signal $S_{out}$, which is transmitted via the aerial/antenna 728 to a base station 620 in a telecommunication network 600 (see FIG. 6). Preferably, a filter arrangement (not shown) is also inserted between the amplifier system and the antenna.

Said terminal 700 also comprises at least one controller 730, such as a microprocessor or central processing unit, for controlling the units of the terminal by using stored, readable and executable software.

Further, the terminal 700 comprises a receiving unit 735 connected to the antenna 728 for receiving transmitted signals and transform them in a second signal processing block 737. If the received signal contains voice, the voice signal is decoded by decoder units and converted by a D/A-converter to an audio signal before being transformed to sound by a loudspeaker 707. The terminal comprises a keyboard 745, a display 747 and a Man-Machine-Interface block (MMI) 740 that allows a user to interactively control the terminal, write and read text messages, initiate telephone calls, etc.

The present invention may be embodied in many different forms and should not be construed as limited to the embodiments set forth herein: rather, these embodiments are provided so that this disclosure will be thorough and complete, and will fully convey the scope of the invention as defined by the enclosed set of claims.

The invention claimed is:

1. A method for linearly amplifying a drive signal ($S_{in}$) by tracking a variable impedance of a load to an amplitude of the drive signal ($S_{in}$) that is fed to at least one amplifier (420), said at least one amplifier is capable of generating and feeding a power amplified output signal ($S_{out}$) to said load ($R_{Ltot}$), the method comprising:
   determining an instant value ($S_{nom}$) related to the amplitude of the drive signal:
   determining an adjusted value ($S_{LUT}$) using an offset value ($S_{off}$) and the instant value ($S_{nom}$):
   generating an adjusted value ($S_{LUT}$) correlated control signal ($v_{cntrl}$) for controlling and adjusting the variable load impedance:
   adjusting the variable load impedance (430) by means of the control signal.

2. The method according to claim 1, wherein the step where the determining an instant value ($S_{nom}$) comprises calculating the instant value corresponding to the input power (abs($S_{in}$)/max abs($S_{in}$))$^2$.

3. The method according to claim 1, where the step of determining an adjusted value ($S_{LUT}$) comprises calculating the equation:

$$S_{LUT}=S_{nom}+S_{off}.$$

4. The method according to claim 1, where the generating an adjusted value ($S_{LUT}$) correlated control signal ($v_{cntrl}$) comprises locating a corresponding adjusted value ($S_{LUT}$) pre-stored in a data storage (LUT; 416) and control a control signal generating means (418) to generate a control signal ($v_{cntrl}$) corresponding to said adjusted value ($S_{LUT}$).

5. The method according to claim 4, where the control signal ($v_{cntrl}$) is connected to said variable load impedance (430).

6. Amplifier system (400) for linearly amplifying a drive signal by tracking a variable impedance of a load ($R_{Ltot}$) to an amplitude of the drive signal that is fed to at least one amplifier, said at least one amplifier is capable of generating and feeding a power amplified output signal to said load, the amplifier system comprises:
   mathematical operator means (412) for determining an instant value related to the amplitude of the drive signal;
   means (414) for determining an adjusted value using an offset value ($S_{off}$) and the instant value ($S_{nom}$);
   transforming means (416, 418) for generating an adjusted value correlated control signal ($v_{cntrl}$):
   impedance tuner (430) for adjusting the variable load impedance ($R_{var}$) by means of the control signal ($v_{cntrl}$).

7. The amplifier system according lo claim 6, where the mathematical operator means (412) calculates the instant value corresponding to the input power (abs($S_{in}$)/max abs ($S_{in}$))$^2$.

8. The amplifier system according to claim 6, where an offset means (414) determines an adjusted value ($S_{LUT}$) by calculating the equation:

$$S_{LUT} = S_{nom} S_{off}.$$

9. The amplifier system according to claim 6, where the transforming means (416, 418) for an adjusted value correlated control signal ($v_{cntrl}$) comprises a data storage (LUT; 416) for locating the corresponding pre-stored adjusted value ($S_{LUT}$) and a control signal generating means (418) for controlling the generation of a control signal ($v_{cntrl}$) corresponding to said adjusted value ($S_{LUT}$).

10. The amplifier system according to claim 6, where the control signal ($v_{cntrl}$) is connected to said variable load impedance (430).

11. The amplifier system according to claim 6, where the mathematical operator (412), the offset means (414), and the transforming means (416, 418) forms a load tracking arrangement (410).

12. The amplifier system according to claim 11, where the load tracking arrangement (410) also comprises the impedance tuner (430), which is a lossless or low loss impedance tuner.

13. The amplifier system according to claim 6, where at least one of the amplifiers is a class A, AB and F and push-pull class B.

14. A radio terminal comprising:
an amplifier system that comprises:
mathematical operator means 412 for determining an instant value ($S_{nom}$) related to an amplitude of a drive signal;
means (414) for determining an adjusted value using an offset value ($S_{off}$) and the instant value ($S_{nom}$);
transforming means (416, 418) for generating an adjusted value correlated control signal ($v_{cntrl}$);
impedance tuner (430) for adjusting the variable load impedance ($R_{var}$) using the control signal ($v_{cntrl}$).

15. The radio terminal according to claim 14, where the radio terminal is a mobile radio terminal.

16. The radio terminal according to claim 14, where the radio terminal is a base station.

17. The radio terminal according to claim 14, where that the radio terminal is located in a transceiver of a satellite system.

18. The radio terminal according to claim 14, where the transforming means (416, 418) for an adjusted value correlated control signal ($v_{cntrl}$) comprises a data storage (LUT; 416) for locating the corresponding pre-stored adjusted value ($S_{LUT}$) and a control signal generating means (418) for controlling the generation of a control signal ($v_{cntrl}$) corresponding to said adjusted value ($S_{LUT}$).

19. The radio terminal according to claim 14, where the control signal ($v_{cntrl}$) is connected to said variable load impedance (430).

20. The radio terminal according to claim 14, where the mathematical operator (412), the offset means (414), and the transforming means (416, 418) forms a load tracking arrangement (410).

* * * * *

UNITED STATES PATENT AND TRADEMARK OFFICE
CERTIFICATE OF CORRECTION

PATENT NO. : 7,956,683 B2  Page 1 of 1
APPLICATION NO. : 12/303697
DATED : June 7, 2011
INVENTOR(S) : Lejon It is certified that error appears in the above-identified patent and that said Letters Patent is hereby corrected as shown below:

In the Claims:

Column 8, Claim 1, Line 28: Please correct "$(_{cntrl})$" to read -- $(v_{cntrl})$ --
Claim 2, Line 32: Please correct "wherein the step where" to read -- where --
Claim 3, Line 36: Please correct "where the step of" to read -- where the --
Claim 7, Line 64: Please correct "according lo claim 6" to read -- according to claim 6 --

Column 9, Claim 8, Line 5: Please correct "$S_{LUT}{}^1S_{nom}S_{off}$" to read -- $S_{LUT}=S_{nom}+S_{off}$ --

Signed and Sealed this
Fourth Day of October, 2011

David J. Kappos
*Director of the United States Patent and Trademark Office*